US012699314B2

(12) United States Patent
Suzuki et al.

(10) Patent No.: US 12,699,314 B2
(45) Date of Patent: Aug. 4, 2026

(54) MULTILAYERED-REFLECTIVE-FILM-PROVIDED SUBSTRATE, REFLECTIVE MASK BLANK, REFLECTIVE MASK, METHOD OF MANUFACTURING REFLECTIVE MASK, AND METHOD OF MANUFACTURING SEMICONDUCTOR DEVICE

(71) Applicant: HOYA Corporation, Tokyo (JP)

(72) Inventors: Kota Suzuki, Tokyo (JP); Takahiro Onoue, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 128 days.

(21) Appl. No.: 17/030,208

(22) Filed: Sep. 23, 2020

(65) Prior Publication Data

US 2021/0096456 A1      Apr. 1, 2021

(30) Foreign Application Priority Data

Sep. 30, 2019    (JP) ................................. 2019-180328
Sep. 16, 2020    (JP) ................................. 2020-155903

(51) Int. Cl.
*G03F 1/60*          (2012.01)
*C03C 17/36*         (2006.01)
         (Continued)

(52) U.S. Cl.
CPC ............ *G03F 1/60* (2013.01); *C03C 17/3636* (2013.01); *C03C 17/3649* (2013.01);
         (Continued)

(58) Field of Classification Search
CPC ......... G03F 1/60; G03F 1/24; C03C 17/3636; C03C 17/3649; C03C 17/3665; H01L 21/0274
See application file for complete search history.

(56) References Cited

U.S. PATENT DOCUMENTS

2002/0045108 A1     4/2002  Lee et al.
2008/0318140 A1    12/2008  Hayashi et al.
          (Continued)

FOREIGN PATENT DOCUMENTS

CN          105074576  B      3/2018
JP          2002122981 A      4/2002
          (Continued)

OTHER PUBLICATIONS

English machine translation of JP-2009054899-A (Mar. 2009) (Year: 2009).*

(Continued)

*Primary Examiner* — Jonathan Johnson
*Assistant Examiner* — Jayson D Cosgrove
(74) *Attorney, Agent, or Firm* — Sughrue Mion, PLLC

(57) ABSTRACT

A multilayered-reflective-film-provided substrate includes: a substrate; a multilayered reflective film provided on the substrate; and a protective film provided on the multilayered reflective film, in which the protective film includes ruthenium (Ru) and at least one additive material selected from aluminum (Al), yttrium (Y), zirconium (Zr), rhodium (Rh), and hafnium (Hf), and a content of the additive material is 5% or more by atom and less than 50% by atom.

21 Claims, 5 Drawing Sheets

(51) Int. Cl.
   *G03F 1/24*          (2012.01)
   *H01L 21/027*        (2006.01)
   *H10P 76/20*         (2026.01)

(52) U.S. Cl.
   CPC ............ *C03C 17/3665* (2013.01); *G03F 1/24*
   (2013.01); *H10P 76/2041* (2026.01); *C03C*
   *2217/254* (2013.01); *C03C 2217/26* (2013.01);
   *C03C 2218/154* (2013.01)

(56)                References Cited

U.S. PATENT DOCUMENTS

| | | | |
|---|---|---|---|
| 2011/0165504 | A1 | 7/2011 | Ikuta |
| 2012/0225375 | A1 | 9/2012 | Mikam |
| 2013/0078555 | A1* | 3/2013 | Orihara ..................... G03F 1/60 |
| | | | 430/5 |
| 2014/0186752 | A1* | 7/2014 | Kinoshita ................. G03F 1/48 |
| | | | 430/5 |
| 2014/0302429 | A1 | 10/2014 | Shoki et al. |
| 2014/0356770 | A1* | 12/2014 | Hayashi .................... G03F 1/24 |
| | | | 430/5 |
| 2015/0205194 | A1 | 7/2015 | Lin et al. |
| 2015/0301441 | A1* | 10/2015 | Hamamoto ............... G03F 1/24 |
| | | | 430/311 |
| 2016/0011344 | A1 | 1/2016 | Beasley et al. |
| 2016/0147139 | A1* | 5/2016 | Onoue ..................... G03F 1/76 |
| | | | 430/311 |
| 2016/0187543 | A1 | 6/2016 | Bekman et al. |
| 2016/0202601 | A1 | 7/2016 | Onoue |
| 2019/0086791 | A1* | 3/2019 | Tanabe ..................... G03F 1/24 |
| 2020/0371421 | A1 | 11/2020 | Ikebe et al. |
| 2021/0103209 | A1 | 4/2021 | Nakagawa et al. |

FOREIGN PATENT DOCUMENTS

| | | | |
|---|---|---|---|
| JP | 2008-016821 A | | 1/2008 |
| JP | 2009054899 A | * | 3/2009 |
| JP | 2009-210802 A | | 9/2009 |
| JP | 2014-116498 A | | 6/2014 |
| JP | 2014170931 A | | 9/2014 |
| JP | 2014-229825 A | | 12/2014 |
| JP | 2015-90421 A | | 5/2015 |
| JP | 2017-227936 A | | 12/2017 |
| JP | 2019-095691 A | | 6/2019 |
| TW | 201243487 A | | 11/2012 |
| TW | 201435485 A | | 9/2014 |
| TW | 201513168 A | | 4/2015 |
| TW | I655458 B | | 4/2019 |
| TW | 201928506 A | | 7/2019 |
| WO | 2010/026998 A1 | | 3/2010 |
| WO | 2011/071086 A1 | | 6/2011 |
| WO | 2012/102313 A1 | | 8/2012 |
| WO | 2015012151 A1 | | 1/2015 |
| WO | 2015/037564 A1 | | 3/2015 |
| WO | 2019/131506 A1 | | 7/2019 |

OTHER PUBLICATIONS

Communication dated Apr. 25, 2025 in Chinese patent application No. 202011059191.0.
Communication dated May 21, 2024 in Singapore patent application No. 10202009397W.
Communication dated Apr. 15, 2024 in Taiwanese patent application No. 109133780.
Communication dated Apr. 3, 2025 in Korean patent application No. 10-2020-0125586.
Communication dated Oct. 11, 2023 in Japanese patent application No. 2020-155903.
Communication dated Apr. 19, 2024 in Japanese patent application No. 2020-155903.
Communication dated Oct. 14, 2025 in Japanese patent application No. 2024-195937.
Communication dated May 26, 2025 in Taiwanese patent application No. 114105763.
Office Action dated May 12, 2026 from the Japanese Patent Office in corresponding Japanese application No. 2024-195937.

* cited by examiner

110

110

100

100

MULTILAYERED-REFLECTIVE-FILM-PROVIDED SUBSTRATE, REFLECTIVE MASK BLANK, REFLECTIVE MASK, METHOD OF MANUFACTURING REFLECTIVE MASK, AND METHOD OF MANUFACTURING SEMICONDUCTOR DEVICE

CROSS-REFERENCE TO RELATED APPLICATIONS

This application claims the benefit of Japanese Application No. 2019-180328, filed Sep. 30, 2019, and Japanese Application No. 2020-155903, filed Sep. 16, 2020, the entire contents of which are hereby incorporated by reference.

BACKGROUND

Technical Field

The present disclosure relates to a reflective mask for use in manufacture of a semiconductor device, and a multilayered-reflective-film-provided substrate and a reflective mask blank that are used for manufacture of the reflective mask. Moreover, the present disclosure relates to a method of manufacturing the semiconductor device with the reflective mask.

Related Art

In recent years, along with demands for further enhancements in the densification and precision of very-large-scale integration (VLSI) devices, an exposure technology with extreme ultra violet (hereinafter, referred to as EUV) light, namely, EUV lithography is regarded as promising. EUV light means light having a wavelength band in a soft X-ray region or in a vacuum ultraviolet region, specifically, light having a wavelength of approximately 0.2 to 100 nm.

A reflective mask includes: a multilayered reflective film for reflection of exposing light, formed on a substrate; and an absorber pattern that is a patterned absorber film for absorption of exposing light, formed on the multilayered reflective film. Incident light on the reflective mask mounted on an exposure machine for pattern transfer onto a semiconductor substrate, is absorbed in the absorber pattern and is reflected off the multilayered reflective film out of the absorber pattern. An optical image reflected off the multilayered reflective film is transferred onto a semiconductor substrate, such as a silicon wafer, through a catoptric system.

For achievement of enhancements in the densification and precision of a semiconductor device with such a reflective mask, the reflective region (surface of the multilayered reflective film) in the reflective mask needs to have high reflectance to EUV light that is exposing light.

As a multilayered reflective film, a multilayered film including periodically layered elements that are different in refractive index is typically used. For example, as a multilayered reflective film to EUV light having a wavelength of 13 to 14 nm, it may be desired to use a Mo/Si periodic layered film including approximately 40 cycles of alternate layers of a Mo film and a Si film.

As a reflective mask for use in EUV lithography, for example, JP 2002-122981 A discloses a reflective mask. JP 2002-122981 A discloses a reflective photomask including: a substrate; a reflective layer including a multilayered film including alternate layers of two different types of films, formed on the substrate; a buffer layer including a ruthenium film formed on the reflective layer; and an absorber pattern having a predetermined patterned shape, formed on the buffer layer, the absorber pattern including a material capable of absorbing soft X-rays. The buffer layer disclosed in JP 2002-122981 A is typically called a protective film.

JP 2014-170931 A discloses a multilayered-reflective-film-provided substrate including a multilayered reflective film that reflects exposing light, on a substrate. Moreover, JP 2014-170931 A discloses that a protective film for protection of the multilayered reflective film is formed on the multilayered reflective film, and the protective film includes a reflectance reduction-inhibition layer, a blocking layer, and an etching stopper layer that are layered in this order. Moreover, JP 2014-170931 A discloses that the etching stopper layer includes ruthenium (Ru) or a ruthenium alloy, and specific examples of the ruthenium alloy include a ruthenium-niobium (RuNb) alloy, a ruthenium-zirconium (RuZr) alloy, a ruthenium-rhodium (RuRh) alloy, a ruthenium-cobalt (RuCo) alloy, and a ruthenium-rhenium (RuRe) alloy.

WO 2015/012151 A and WO 2015/037564 A each disclose a multilayered-reflective-film-provided substrate including: a substrate; a multilayered reflective film; and a Ru-based protective film for protection of the multilayered reflective film, formed on the multilayered reflective film. WO 2015/012151 A and WO 2015/037564 A each disclose that the surface layer on the far side of the multilayered reflective film to the substrate includes Si.

WO 2015/012151 A discloses that a block layer that prevents Si from transitioning to the Ru-based protective film, is interposed between the multilayered reflective film and the Ru-based protective film. WO 2015/012151 A discloses that examples of the constituent material of the Ru-based protective film 18 include Ru and Ru alloy materials, and preferable is, as a Ru alloy, a Ru compound including Ru and at least one type of metallic element selected from the group consisting of Nb, Zr, Rh, Ti, Co, and Re.

Moreover, WO 2015/037564 A discloses that the Ru-based protective film includes a Ru compound including Ru and Ti, and the Ru compound is larger in the amount of Ru than RuTi in stoichiometric composition.

SUMMARY

In a process of manufacture of a reflective mask, at the time of formation of an absorber pattern, etching treatment is performed on an absorber film through at least one of a resist film and an etching mask film. For meeting the shape of the absorber pattern to the design, at the time of etching treatment of the absorber film, slight overetching may be needed. Thus, the film under the absorber film (film on the near side to the substrate) is subjected to etching. In order to prevent the multilayered reflective film under the absorber film from being damaged at the time of overetching to the absorber film, a protective film is provided. Therefore, the protective film should have high resistance to etching gas to the absorber film.

As the material of the protective film having high resistance to etching gas to the absorber film, for example, Ru or RuNb is used. In a case where the etching mask film formed on the absorber film includes a Cr-based material, in order to remove the etching mask film, a gaseous mixture of chlorine gas and oxygen gas is used as etching gas. The protective film including Ru or RuNb has low resistance to a gaseous mixture that includes oxygen gas. Thus, at the time of removal of the etching mask film, the multilayered reflective film formed under the protective film is likely to be damaged. Moreover, the protective film damaged at the time of removal of the etching mask film is likely to have inadequate resistance in the following process of correction of the absorber pattern.

In EUV lithography at the time of manufacture of a semiconductor device, transparent matter to exposing light is small in amount. Thus, it is technically difficult to achieve an EUV pellicle for prevention of foreign substances from adhering to the mask-pattern face of the reflective mask. Moreover, in EUV lithography, exposure contamination occurs, such as accumulation of a carbon film or the growth of an oxide film on the mask due to EUV exposure. Thus, at the stage where the mask is in use in manufacture of a semiconductor device, the mask needs repeated cleaning with cleaning solution, such as sulfuric acid and hydrogen peroxide mixture (SPM), in order to remove any foreign substances and contamination on the mask. However, the protective film including Ru or RuNb has inadequate resistance to SPM cleaning.

A thin film including Ru or RuNb as material crystallizes easily and has high crystallinity. A thin film having high crystallinity is inferior in compactness to an amorphous thin film. That may be why the protective film including Ru or RuNb as material has low resistance to predetermined etching gas and has inadequate resistance to cleaning, such as SPM cleaning.

Therefore, an aspect of the present disclosure is to provide a reflective mask including a protective film having high resistance to etching gas and high resistance to cleaning. Moreover, another aspect of the present disclosure is to provide a multilayered-reflective-film-provided substrate and a reflective mask blank for manufacture of the reflective mask including the protective film having high resistance to etching gas and high resistance to cleaning.

The present disclosure has the following configurations which may be used to solve the problems.
(Configuration 1)

According to Configuration 1 of the present disclosure, a multilayered-reflective-film-provided substrate includes: a substrate; a multilayered reflective film provided on the substrate; and a protective film provided on the multilayered reflective film, in which the protective film includes ruthenium (Ru) and additive material; the additive material includes at least one of the following elements: aluminum (Al), yttrium (Y), zirconium (Zr), rhodium (Rh), and hafnium (Hf); and a content of the additive material is 5% or more by atom and less than 50% by atom.
(Configuration 2)

According to Configuration 2 of the present disclosure, in the multilayered-reflective-film-provided substrate according to Configuration 1, the protective film includes a first layer and a second layer in order from a side closer to the substrate, the first layer includes ruthenium (Ru) and at least one selected from magnesium (Mg), aluminum (Al), titanium (Ti), vanadium (V), chromium (Cr), germanium (Ge), zirconium (Zr), niobium (Nb), molybdenum (Mo), rhodium (Rh), hafnium (Hf), and tungsten (W), and the second layer includes ruthenium (Ru) and the additive material.
(Configuration 3)

According to Configuration 3 of the present disclosure, in the multilayered-reflective-film-provided substrate according to Configuration 1 or 2, the protective film, the first layer, or the second layer further includes nitrogen (N).

(Configuration 4)

According to Configuration 4 of the present disclosure, in the multilayered-reflective-film-provided substrate according to any of Configurations 1 to 3, a content of Ru in the second layer is less than a content of Ru in the first layer.
(Configuration 5)

According to Configuration 5 of the present disclosure, a reflective mask blank includes: an absorber film on the protective film of the multilayered-reflective-film-provided substrate according to any of Configurations 1 to 4.
(Configuration 6)

According to Configuration 6 of the present disclosure, the reflective mask blank according to Configuration 5, further includes: an etching mask film including chromium (Cr), on the absorber film.
(Configuration 7)

According to Configuration 7 of the present disclosure, a reflective mask includes: an absorber pattern including the absorber film in the reflective mask blank according to Configuration 5 or 6, patterned.
(Configuration 8)

According to Configuration 8 of the present disclosure, a method of manufacturing a reflective mask, includes: patterning the etching mask film of the reflective mask blank according to Configuration 6 to form an etching mask pattern; patterning the absorber film with the etching mask pattern as a mask, to form an absorber pattern; and removing the etching mask pattern by a gaseous mixture of chlorine-based gas and oxygen gas.
(Configuration 9)

According to Configuration 9 of the present disclosure, a method of manufacturing a semiconductor device, includes: setting the reflective mask according to Configuration 7 to an exposure device including an exposure light source that emits EUV light; and transferring a transfer pattern to a resist film formed on a substrate to which transfer is to be performed.

According to the present disclosure, a reflective mask including a protective film having high resistance to etching gas and high resistance to cleaning can be provided. Moreover, according to the present disclosure, a multilayered-reflective-film-provided substrate and a reflective mask blank for manufacture of the reflective mask including the protective film having high resistance to etching gas and high resistance to cleaning can be provided.

DETAILED DESCRIPTION

An embodiment of the present disclosure will be specifically described below with reference to the drawings. Note that the following embodiment is intended for specific description of the present disclosure, and thus the present disclosure is not limited to the scope thereof.

Figure 1:
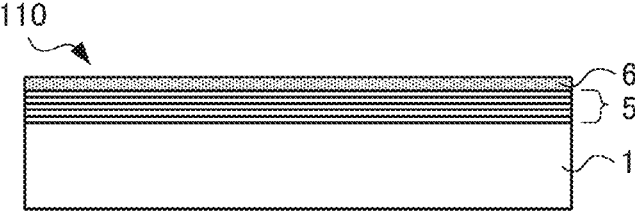
FIG. 1 is a schematic sectional view of an exemplary multilayered-reflective-film-provided substrate according to the present embodiment.

FIG. 1 is a schematic sectional view of an exemplary multilayered-reflective-film-provided substrate 110 according to the present embodiment. The multilayered-reflective-film-provided substrate 110 illustrated in FIG. 1 includes a multilayered reflective film 5 and a protective film 6. Note that the multilayered-reflective-film-provided substrate 110 can further include a different thin film, such as a back-surface conductive film 2.

Figure 2:
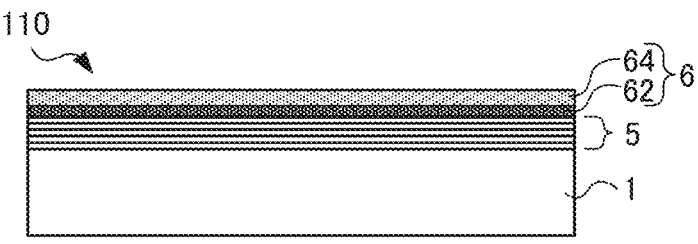
FIG. 2 is a schematic sectional view of another exemplary multilayered-reflective-film-provided substrate according to the present embodiment.

FIG. 2 is a schematic sectional view of a multilayered-reflective-film-provided substrate 110 similar to that in FIG. 1. Note that the multilayered-reflective-film-provided substrate 110 illustrated in FIG. 2 includes a protective film 6 including a first layer 62 and a second layer 64.

Figure 3:
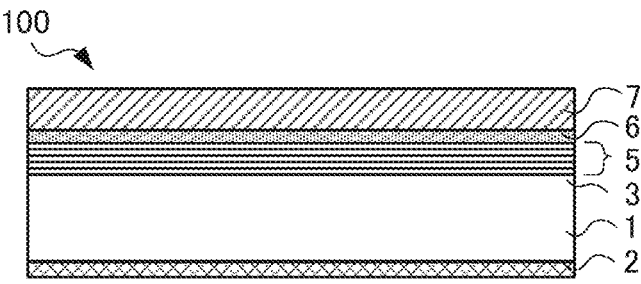
FIG. 3 is a schematic sectional view of an exemplary reflective mask blank according to the present embodiment.

FIG. 3 is a schematic sectional view of an exemplary reflective mask blank 100 according to the present embodiment. The reflective mask blank 100 illustrated in FIG. 3 includes a back-surface conductive film 2, a substrate 1 for a mask blank with a front-side main surface 3, a multilayered reflective film 5, a protective film 6, and an absorber film 7. Note that the reflective mask blank 100 can further include a different thin film, such as a resist film 8.

Figure 4:
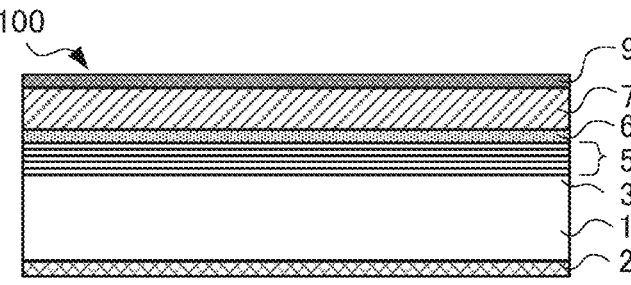
FIG. 4 is a schematic sectional view of another exemplary reflective mask blank according to the present embodiment.

FIG. 4 is a schematic sectional view of an exemplary reflective mask blank 100 further including an etching mask film 9 in comparison to the configuration illustrated in FIG. 3. Note that the reflective mask blank 100 can further include a different thin film, such as a resist film 8.

In the present specification, in some cases, the main surface on which a multilayered reflective film 5 is formed, of the main surfaces of a substrate 1 for a mask blank, is referred to as a "front-side main surface" 3 (or "first main surface"). Moreover, in some cases, the main surface on which no multilayered reflective film 5 is formed, is referred to as a "back-side main surface" (or "second main surface"). A back-surface conductive film 2 is formed on the "back-side main surface" (or "second main surface").

In the present specification, "a substrate 1 for a mask blank has a predetermined thin film on a main surface thereof" means that the predetermined thin film is disposed in contact with the main surface of the substrate 1 for a mask blank or that a different film is interposed between the substrate 1 for a mask blank and the predetermined thin film. Moreover, for example, "a film A has a film B thereon" means that the film A and the film B are disposed in direct contact with each other or that a different film is interposed between the film A and the film B. Moreover, in the present specification, for example, "a film A is disposed in contact with the surface of a film B" means that the film A and the film B are disposed in direct contact with each other with no different film interposed between the film A and the film B.

Next, surface roughness (Rms) will be described that is a parameter indicating a surface aspect of a substrate 1 for a mask blank and a surface aspect of the surface of a thin film included in a reflective mask blank 100 or the like.

Root mean square (Rms) as a representative indicator for surface roughness is root mean square roughness, and is the square root of the mean squared deviation from an average line to a measured curve. The Rms is expressed by the following Expression (1).

[Mathematical Formula 1]

$$Rms = \sqrt{\frac{1}{l} \int_0^l Z^2(x)\,dx} \tag{1}$$

In Expression (1), l represents the reference length, and Z represents the height from the average line to the measured curve.

The Rms is conventionally used in management of the surface roughness of a substrate 1 for a mask blank, and enables a numerical grasp of the surface roughness.

<Multilayered-Reflective-Film-Provided Substrate 110>

A substrate 1 and each thin film included in a multilayered-reflective-film-provided substrate 110 that is a type of thin-film-provided substrate 1 according to the present embodiment, will be described.

<<Substrate 1>>

The substrate 1 in the multilayered-reflective-film-provided substrate 110 according to the present embodiment needs to prevent an absorber pattern 7a from distorting due to heat at the time of EUV exposure. Thus, preferably, the substrate 1 has a low coefficient of thermal expansion within the range of 0±5 ppb/° C. Examples of a base material having a low coefficient of thermal expansion in the range, that can be used, include $SiO_2$—$TiO_2$-based glass and multicomponent-based glass ceramics.

From the viewpoint of at least required precision of pattern transfer and precision of position, the first main surface (front-side main surface) of the substrate 1 on the side on which a transfer pattern (including an absorber film 7 to be described later) is to be formed, is subjected to surface treatment so as to have a predetermined degree of flatness. For EUV exposure, the degree of flatness is preferably 0.1 μm or less in a region of 132×132 mm on the first main surface of the substrate 1 on the side on which the transfer pattern is to be formed, or more preferably, 0.05 μm or less, or further preferably, 0.03 μm or less. Moreover, the second main surface (back-side main surface) on the opposite side to the side on which the absorber film 7 is to be formed, is electrostatically chucked at the time of setting to an exposure device. In a region of 132×132 mm, the degree of flatness of the second main surface is preferably 0.1 μm or less, or more preferably, 0.05 μm or less, or further preferably, 0.03 μm or less. Note that, in a region of 142×142 mm, the degree of flatness of the second main surface of a reflective mask blank 100 is preferably 1 μm or less, or more preferably, 0.5 μm or less, or further preferably, 0.3 μm or less.

Moreover, the height in surface smoothness of the substrate 1 is a significantly important item. The surface roughness of the first main surface on which the absorber pattern 7a for transfer is to be formed, is preferably 0.15 nm or less in root mean square roughness (Rms), or more preferably, 0.10 nm or less in Rms. Note that the surface smoothness can be measured with an atomic force microscope.

Furthermore, for prevention of deformation due to the stress of a film (e.g., a multilayered reflective film 5) formed on the substrate 1, preferably, the substrate 1 has high rigidity. In particular, preferably, the substrate 1 has a high Young's modulus, such as 65 GPa or more.

<<Underfilm>>

The multilayered-reflective-film-provided substrate 110 according to the present embodiment can include an underfilm in contact with the surface of the substrate 1 The underfilm is a thin film formed between the substrate 1 and the multilayered reflective film 5. Provision of the underfilm may enable prevention of charging up due to electron beams at the time of mask-pattern defect inspection, reduction in phase defect to the multilayered reflective film 5, and/or acquisition of high surface smoothness.

As the material of the underfilm, it may be desired to use a material including, as a main component, ruthenium or tantalum. For example, a Ru metallic elementary substance or a Ta metallic elementary substance may be provided. Alternatively, a Ru alloy containing Ru or a Ta alloy containing Ta may be provided, the Ru alloy and the Ta alloy each containing at least one of the following metals: titanium (Ti), niobium (Nb), molybdenum (Mo), zirconium (Zr), yttrium (Y), boron (B), lanthanum (La), cobalt (Co), and rhenium (Re). It may be desired for the thickness of the underfilm to be, for example, in the range between 1 to 10 nm.

<<Multilayered Reflective Film 5>>

The multilayered-reflective-film-provided substrate 110 according to the embodiment includes a multilayered reflective film 5. The multilayered reflective film 5 has a function of reflecting EUV light, in a reflective mask 200. The multilayered reflective film 5 is a multilayered film including periodically disposed layers including respective elements, as main components, that are different in refractive index.

Typically, as the multilayered reflective film 5, a multilayered film including approximately 40 to 60 cycles of alternate layers of a high-refractive-index layer and a low-refractive-index layer is used, the high-refractive-index layer being a thin film of a light element or a thin film of a compound thereof that is a high-refractive-index material, the low-refractive-index layer being a thin film of a heavy element or a thin film of a compound thereof that is a low-refractive-index material.

As the multilayered reflective film 5, a multilayered film including a layered structure having a plurality of cycles of a high-refractive-index layer and a low-refractive-index layer may be used, each cycle of the high-refractive-index layer/low-refractive-index layer layered structure including a high-refractive-index layer and a low-refractive-index layer layered in this order from the side closer to the substrate 1. Alternatively, a multilayered film including a layered structure having a plurality of cycles of a low-refractive-index layer and a high-refractive-index layer may be used, each cycle of the low-refractive-index layer/high-refractive-index layer layered structure including a low-refractive-index layer and a high-refractive-index layer layered in this order from the side closer to the substrate 1. Note that the outermost layer of the multilayered reflective film 5, namely, the surface layer on the far side of the multilayered reflective film 5 to the substrate 1 is preferably the high-refractive-index layer. For the multilayered film including a layered structure having a plurality of cycles of a high-refractive-index layer and a low-refractive-index layer, each cycle of the high-refractive-index layer/low-refractive-index layer layered structure including a high-refractive-index layer and a low-refractive-index layer layered in this order from the side closer to the substrate 1, the uppermost layer is the low-refractive-index layer. In this case, the reflectance of the reflective mask 200 drops because of easy oxidation of the low-refractive-index layer that is the outermost surface of the multilayered reflective film 5. Thus, preferably, for the multilayered reflective film 5, the high-refractive-index layer is further formed on the low-refractive-index layer that is the uppermost layer. Meanwhile, for the multilayered film including a layered structure having a plurality of cycles of a low-refractive-index layer and a high-refractive-index layer, each cycle of the low-refractive-index layer/high-refractive-index layer layered structure including a low-refractive-index layer and a high-refractive-index layer layered in this order from the side closer to the substrate 1, the uppermost layer is the high-refractive-index layer. Therefore, in this case, no further formation of the high-refractive-index layer is required.

As the high-refractive-index layer, a layer including silicon (Si) can be used. As a material including Si, in addition to a Si elementary substance, a Si compound including Si and at least one of boron (B), carbon (C), nitrogen (N), oxygen (O), and hydrogen (H) may be used. Use of the high-refractive-index layer including Si enables acquisition of the reflective mask 200 having excellent reflectance to EUV light. Moreover, as the low-refractive-index layer, a metallic elementary substance selected from molybdenum (Mo), ruthenium (Ru), rhodium (Rh), and platinum (Pt), or any alloy thereof may be used. Moreover, each metallic elementary substance or alloy may have at least one of boron (B), carbon (C), nitrogen (N), oxygen (O), and hydrogen (H) added thereto. In the multilayered-reflective-film-provided substrate 110 according to the present embodiment, preferably, the low-refractive-index layer is a molybdenum (Mo) layer and the high-refractive-index layer is a silicon (Si) layer. For example, as the multilayered reflective film 5 for reflecting EUV light having a wavelength of 13 to 14 nm, it may be desired to use a Mo/Si periodic layered film including approximately 40 to 60 cycles of alternate layers of a Mo layer and a Si layer. Note that the high-refractive-index layer that is the uppermost layer of the multilayered reflective film 5, is formed of silicon (Si), so that a silicon oxide layer including silicon and oxygen can be formed between the uppermost layer (Si) and a protective film 6. This structure enables improvement in resistance to mask cleaning.

The reflectance of only the multilayered reflective film 5 is typically 65% or more, and the upper limit is typically 73%. Note that the thickness and cycle of each constituent layer in the multilayered reflective film 5 can be appropriately selected in accordance with the wavelength of exposure. Specifically, the thickness and cycle of each constituent layer in the multilayered reflective film 5 can be selected to satisfy the law of Bragg reflection. The multilayered reflective film 5 includes a plurality of high-refractive-index layers and a plurality of low-refractive-index layers. The high-refractive-index layers are not necessarily identical in thickness and the low-refractive-index layers are not necessarily identical in thickness. Moreover, the thickness of the outermost Si layer of the multilayered reflective film 5 can be adjusted in the range in which the reflectance does not drop. The thickness of the outermost Si (high-refractive-index layer) can be made 3 to 10 nm.

A method of forming the multilayered reflective film 5 is publicly known in the technical field. For example, each layer is deposited by use of an ion-beam sputtering method, resulting in formation of the multilayered reflective film 5. For the Mo/Si periodic layered film described above, for example, by use of an ion-beam sputtering method, a Si film having a thickness of approximately 4 nm is first deposited on the substrate 1 by use of a Si target and then a Mo film having a thickness of approximately 3 nm is deposited by use of a Mo target. The process is defined as one cycle. Then, layering is performed by 40 to 60 cycles, resulting in formation of the multilayered reflective film 5 (the outermost layer is a Si film). Note that 60 cycles larger in the number of processes than 40 cycles enable a rise in reflectance to EUV light.

<<Protective Film 6>>

As illustrated in FIGS. 1 and 2, the multilayered-reflective-film-provided substrate 110 according to the present embodiment includes a protective film 6 on the multilayered reflective film 5. Provision of the protective film 6 on the multilayered reflective film 5 enables inhibition of damage to the surface of the multilayered reflective film 5 at the time of manufacture of the reflective mask 200 with the multilayered-reflective-film-provided substrate 110. Thus, the characteristic of reflectance of the acquired reflective mask 200 is favorable to EUV light.

The protective film 6 according to the present embodiment includes ruthenium (Ru) and additive material. The additive material includes at least one of the following elements: aluminum (Al), yttrium (Y), zirconium (Zr), rhodium (Rh), and hafnium (Hf). A thin film including Ru as material crystallizes easily and has high crystallinity. A thin film having high crystallinity is typically inferior in compactness to an amorphous thin film. Thus, causing the protective film 6 to include the additive material enables enhancement in the compactness of the protective film 6, so that the protective film 6 can have high resistance to etching gas and high resistance to cleaning. Note that the protective film 6 corresponds to a second layer 64 to be described later. As described later, the protective film 6 can further include a first layer 62, in addition to the second layer 64 (refer, e.g., to FIG. 2).

The content of the additive material in the protective film 6 according to the present embodiment is 5% or more by atom and less than 50% by atom. The content of the additive material is preferably 10% or more by atom, or more preferably, 20% or more by atom. Moreover, the content of the additive material is preferably 40% or less by atom, or more preferably, 35% or less by atom. Adjustment of the content of the additive material enables formation of the protective film 6 having high resistances to etching gas and SPM cleaning without a large drop in reflectance to EUV. Therefore, the content of the additive material in the protective film 6 in a predetermined range enables inhibition of the multilayered reflective film 5 provided with the protective film 6 from dropping in reflectance to EUV light and enables enhancement in resistances to etching gas and cleaning. Moreover, in a case where the additive material is larger in extinction coefficient k than ruthenium (Ru), the extinction coefficient of the protective film 6 may be adjusted, for example to 0.030 or less, or more preferably to 0.025 or less.

The content of the additive material in the protective film 6 described above can be adopted to the content of the additive material in the second layer 64 to be described later. That is, the content of the additive material in the second layer 64 can be made 5% or more by atom and less than 50% by atom. Moreover, the content of the additive material is preferably 10% or more by atom, or more preferably, 20% or more by atom. Moreover, the content of the additive material is preferably 40% or less by atom, or more preferably, 35% or less by atom.

Next, a case where the additive material included in the protective film 6 is aluminum (Al), yttrium (Y), zirconium (Zr), rhodium (Rh), or hafnium (Hf), will be described. Note that the protective film 6 in the following description can be adopted to the second layer 64 to be described later.

For the material of the protective film 6 (or the second layer 64), in a case where aluminum (Al) is added as the additive material to ruthenium (Ru) (e.g., a RuAl film), the protective film 6 has improvements in etching resistance to a gaseous mixture of chlorine-based gas and oxygen gas, etching resistance to fluorine gas, and cleaning resistance to sulfuric acid and hydrogen peroxide mixture (SPM). A too low concentration of Al in the protective film 6 causes no effect of addition and a too high concentration of Al causes a rise in the extinction coefficient of the protective film 6 to EUV light, resulting in a drop in the reflectance of the reflective mask 200. Moreover, a too high concentration of Al causes low resistance to fluorine gas. Thus, the concentration of Al in the protective film 6 is preferably 5% or more by atom and 40% or less by atom, or more preferably, 10% or more by atom and 25% or less by atom.

For the material of the protective film 6 (or the second layer 64), in a case where yttrium (Y) is added as the additive material to ruthenium (Ru) (e.g., a RuY film), the protective film 6 has improvements in etching resistance to a gaseous mixture of chlorine-based gas and oxygen gas and etching resistance to fluorine-based gas. A too low concentration of Y in the protective film 6 causes no effect of addition and a too high concentration of Y causes the protective film 6 to have low cleaning resistance to sulfuric acid and hydrogen peroxide mixture (SPM). Thus, the concentration of Y in the protective film 6 is preferably 5% or more by atom and less than 50% by atom, or more preferably, 10% or more by atom and 40% or less by atom.

For the material of the protective film 6 (or the second layer 64), in a case where zirconium (Zr) is added as the additive material to ruthenium (Ru) (e.g., a RuZr film), the protective film 6 has an improvement in etching resistance to a gaseous mixture of chlorine-based gas and oxygen gas. A too low concentration of Zr in the protective film 6 causes no effect of addition and a too high concentration of Zr causes the protective film 6 to have low cleaning resistance to sulfuric acid and hydrogen peroxide mixture (SPM). Moreover, a too high concentration of Zr causes low resistance to chlorine-based gas. Thus, the concentration of Zr in the protective film 6 is preferably 5% or more by atom and 45% or less by atom, or more preferably, 10% or more by atom and 25% or less by atom.

For the material of the protective film 6 (or the second layer 64), in a case where rhodium (Rh) is added as the additive material to ruthenium (Ru) (e.g., a RuRh film), the protective film 6 has improvements in etching resistance to a gaseous mixture of chlorine-based gas and oxygen gas, etching resistance to chlorine-based gas, etching resistance to fluorine-based gas, and cleaning resistance to sulfuric acid and hydrogen peroxide mixture (SPM). A too low concentration of Rh in the protective film 6 causes no effect of addition and a too high concentration of Rh causes a rise in the extinction coefficient k of the protective film 6 to EUV light, resulting in a drop in the reflectance of the reflective mask 200. Thus, the concentration of Rh in the protective film 6 is preferably 15% or more by atom and less than 50% by atom, or more preferably, 20% or more by atom and 40% or less by atom.

Figure 5:
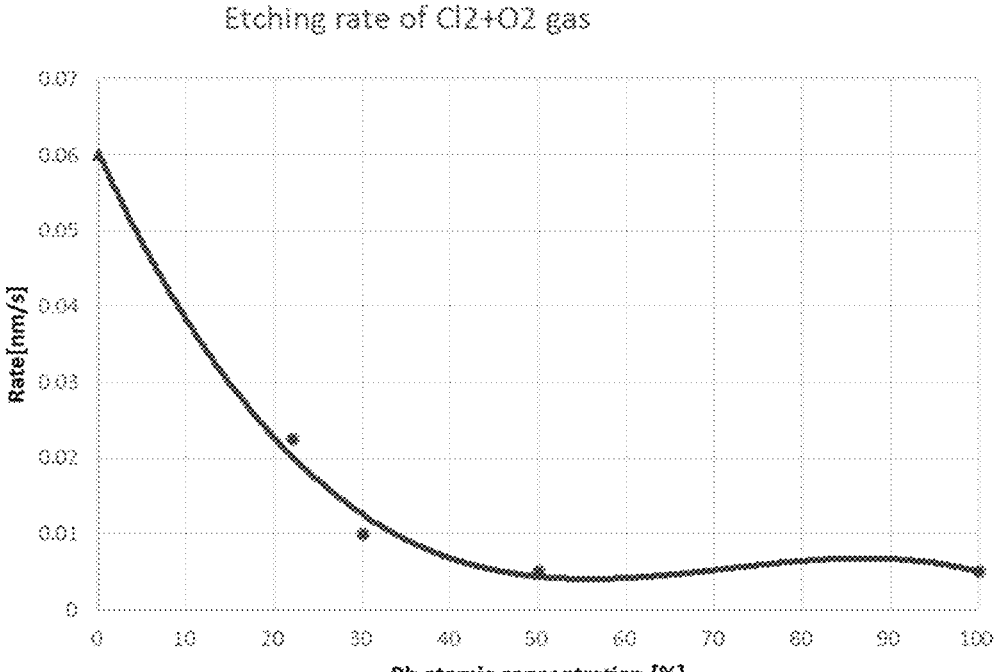
FIG. 5 is a graph of a relationship between content of Rh and etching rate of a protective film due to a gaseous mixture.

FIG. 5 illustrates, in a case where Rh is added as the additive material to Ru, the relationship between the content of Rh (% by atom: horizontal axis) and the etching rate of the protective film due to a gaseous mixture ($Cl_2+O_2$ gas) (nm/s: vertical axis). When the content of Rh is 20% by atom or more, the rate of drop in etching rate starts gentle. When the content of Rh is 30% by atom or more, the tendency gets stronger. When the content of Rh is 50% by atom or more, the etching rate barely varies. Therefore, increasing the content of Rh enables improvement in the etching resistance of the protective film. Thus, preferably, the content of Rh is increased until the rate of drop in etching rate starts gentle. However, when the content of Rh exceeds 50% by atom, the etching rate barely varies. Thus, the content of Rh does not need to exceed 50% by atom. Furthermore, a rise in the content of Rh causes a drop in reflectance, and excess of the content of Rh over 50% by atom causes no desired reflectance. Thus, the content of Rh is preferably less than 50% by atom. As above, consideration of improvement in etching resistance and a drop in reflectance due to addition of Rh, based on the acquired knowledge, enables acquisition of an excellent multilayered-reflective-film-provided substrate.

In a case where the protective film 6 (or the second layer 64) includes ruthenium (Ru) and rhodium (Rh), the following conditions may be preferable. In the present specification, a peak detected by use of an X-ray diffraction method can correspond to a peak in illustration of measurement data of diffracted X-ray intensity at the angle of diffraction $2\theta$ with CuK$\alpha$ line. The height of the peak after subtracting background noise from the measurement data (diffracted X-ray spectrum) is double or more the level of background noise near the peak. The angle of diffraction $2\theta$ of the peak can correspond to the angle of diffraction $2\theta$ at which the peak after subtracting background noise from the measurement data is maximum in value (angle between the direction of incident X rays and the direction of diffracted X rays).

Figure 6:
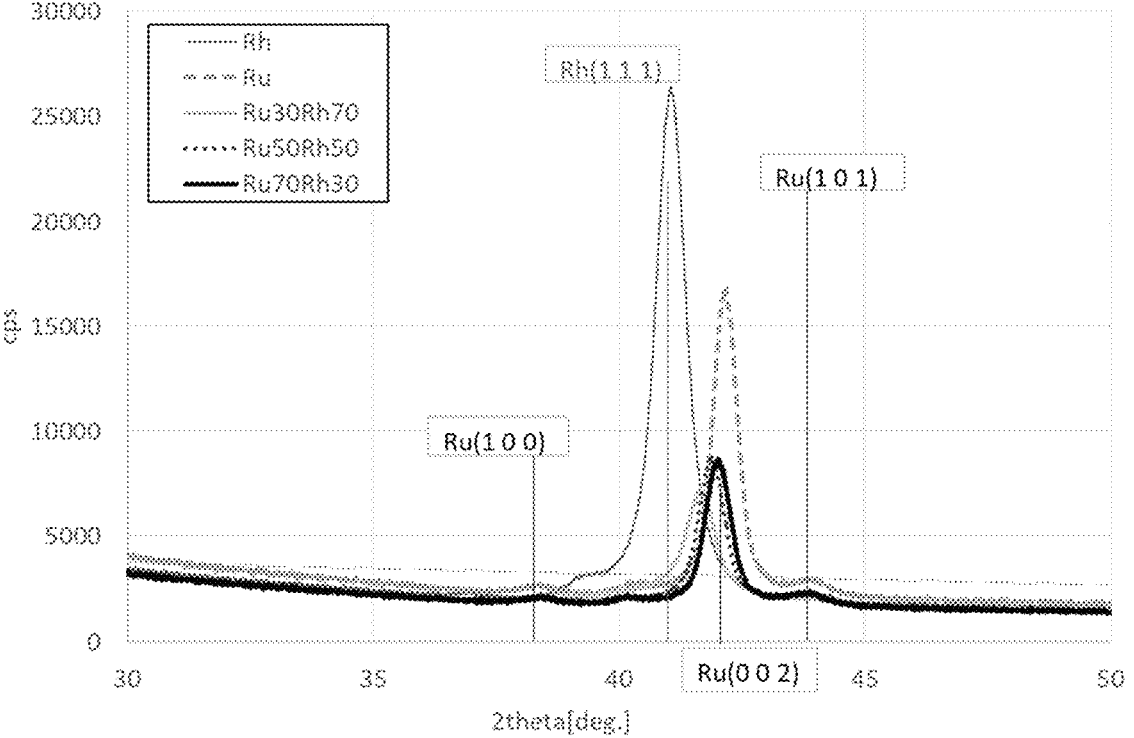
FIG. 6 is a graph of measurement results of diffracted X-ray intensity (CPS) at an angle of diffraction $2\theta$.

FIG. 6 illustrates, for a single film of ruthenium (Ru) (crystal orientation is indicated in parentheses), a single film of rhodium (Rh), and RuRh films (depositions with the following ratios: Ru:Rh=70:30, Ru:Rh=50:50, Ru:Rh=30:70), measurement results of the diffracted X-ray intensity (CPS) (vertical axis) at the angle of diffraction $2\theta$ (horizontal axis) by use of the X-ray diffraction method with CuK$\alpha$ line. The single film of ruthenium (Ru) and the single film of rhodium (Rh) each indicate a relatively high CPS at the angle of diffraction $2\theta$. Therefore, the single film of ruthenium (Ru) and the single film of rhodium (Rh) each have relatively high crystallinity. For the RuRh films, the CPS at the angle of diffraction $2\theta$ varies depending on the ratio between Ru and Rh. The CPS at the angle of diffraction $2\theta$ is lowest in the case of Ru:Rh=30:70. Therefore, for the RuRh films, a larger content of Rh causes lower crystallinity, resulting in higher compactness. Note that a rise in the content of Rh causes a drop in reflectance, and excess of the content of Rh over 50% by atom causes no desired reflectance. Thus, the content of Rh is preferably less than 50% by atom as described above.

Moreover, as illustrated in FIG. 6, in the case of Ru:Rh=70:30, the angle of diffraction is 42.0 degrees and the full width at half maximum is 0.62. In the case of Ru:Rh=50:50, the angle of diffraction is 41.9 degrees and the full width at half maximum is 0.64. In the case of Ru:Rh=30:70, the angle of diffraction is 41.7 degrees and the full width at half maximum is 0.75.

Preferably, a peak is present at the angle of diffraction $2\theta$ ranging between 41.0 and 43.0 degrees, and the full width at half maximum of the peak is 0.6 degrees or more. The single film of ruthenium (Ru (002)) has a full width at half maximum slightly less than 0.6 degrees. Unfavorably, a fall below 0.6 degrees in the full width at half maximum causes high crystallinity. In a case where the full width at half maximum of the peak is less than 0.6 degrees, the crystallinity rises and the compactness drops, resulting in low etching resistance and low cleaning resistance.

As above, on the basis of the range of the angle of diffraction $2\theta$ of the peak and the full width at half maximum of the peak, the crystallinity can be controlled. Control of the crystallinity enables high resistance to predetermined etching gas and high cleaning resistance to SPM or the like. The angle of diffraction $2\theta$ of the peak is preferably 41.0 degrees or more, or more preferably, 41.3 degrees or more. Moreover, the angle of diffraction $2\theta$ of the peak is preferably 43.0 degrees or less, or more preferably, 42.0 degrees or less. The full width at half maximum of the peak is preferably 0.6 degrees or more, or more preferably, 0.65 degrees or more. Moreover, the full width at half maximum of the peak is preferably 0.8 degrees or less.

Figure 7:
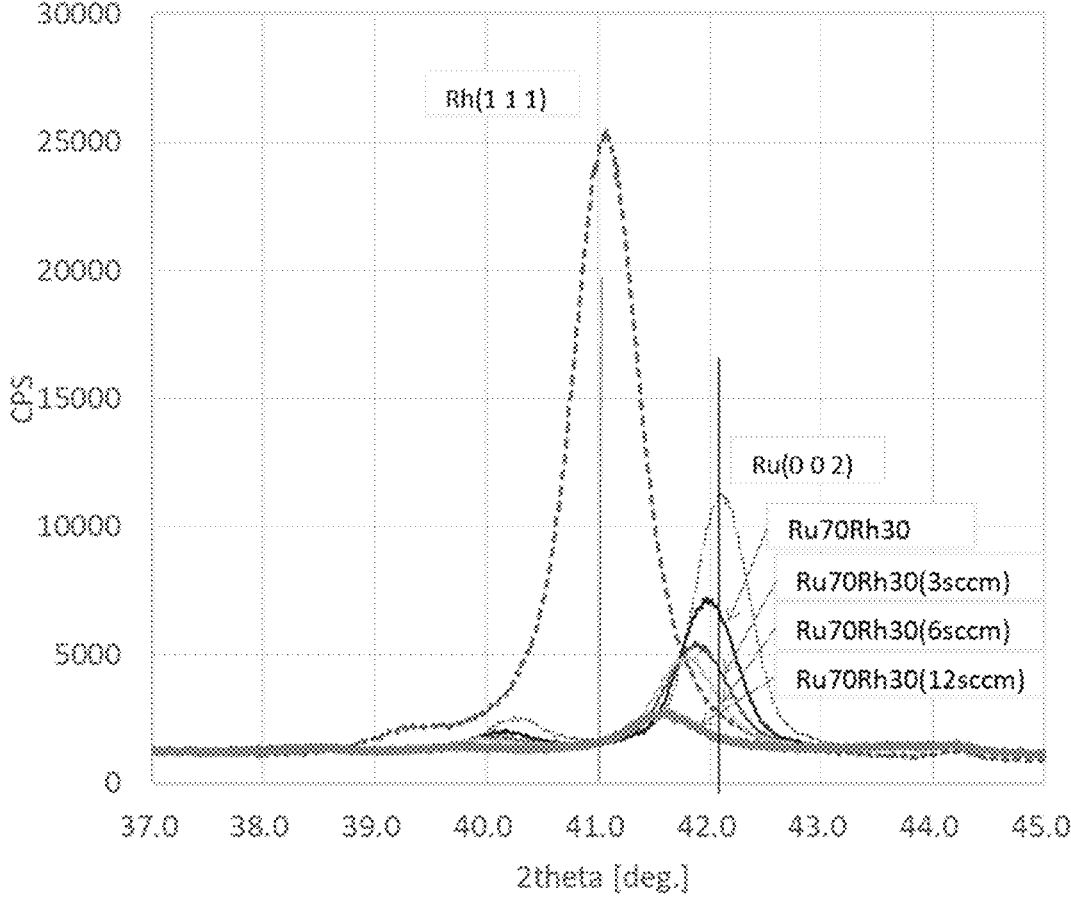
FIG. 7 is a graph of measurement results of diffracted X-ray intensity (CPS) at the angle of diffraction $2\theta$ for films deposited with introduction of nitrogen (N)

FIG. 7 illustrates, for three types of films to which nitrogen (N) is introduced (the amounts of introduction of N are 3, 6, and 12 sccm) at the time of deposition of a RuRh film (Ru:Rh=70:30), measurement results of the diffracted X-ray intensity (CPS) at the angle of diffraction $2\theta$ by use of the X-ray diffraction method with CuK$\alpha$ line. As illustrated in FIG. 7, in a case where the amount of introduction of N is 3 sccm, the angle of diffraction is 41.9 degrees and the full width at half maximum is 0.68. In a case where the amount of introduction of N is 6 sccm, the angle of diffraction is 41.8 degrees and the full width at half maximum is 0.68. In a case where the amount of introduction of N is 12 sccm, the angle of diffraction is 41.6 degrees and the full width at half maximum is 0.78. The measurement results of the other films are the same as those in FIG. 6. The angle of diffraction $2\theta$ of the peak of the RuRh film (Ru:Rh=70:30) is theoretically expected to be 41.8 degrees. Addition of nitrogen enables the protective film to have high compactness and additionally enables the angle of diffraction $2\theta$ of the peak of the protective film to come close to 41.8 degrees. Bringing the angle of diffraction $2\theta$ of the peak of the protective film close to 41.8 degrees enables reduction of residual stress in the protective film.

Therefore, in a case where the protective film 6 (or the second layer 64) includes ruthenium (Ru) and rhodium (Rh), preferably, the protective film further includes nitrogen (N). Causing the protective film to include N enables a drop in the crystallinity of the protective film and improvement in the compactness of the protective film. Moreover, the presence of nitrogen at the interface between the protective film and at least one of the upper film to the protective film and the lower film to the protective film and reduction of residual stress in the protective film enable improvement in the adhesion therebetween, resulting in improvement in cleaning resistance. Furthermore, improving the adhesion enables improvement in blister resistance (e.g., the phenomenon in which the absorber film gradually comes off the surface of the protective film in a case where hydrogen gas is introduced to the atmosphere during exposure, is called a "blister").

For the material of the protective film 6 (or the second layer 64), in a case where hafnium (Hf) is added as the additive material to ruthenium (Ru) (e.g., a RuHf film), the protective film 6 has improvements in etching resistance to a gaseous mixture of chlorine-based gas and oxygen gas and cleaning resistance to sulfuric acid and hydrogen peroxide mixture (SPM). A too low concentration of Hf in the protective film 6 causes no effect of addition and a too high concentration of Hf causes a rise in the extinction coefficient k of the protective film 6 to EUV light, resulting in a drop in the reflectance of the reflective mask 200. Thus, the concentration of Hf in the protective film 6 is preferably 5% or more by atom and 30% or less by atom, or more preferably, 10% or more by atom and 25% or less by atom.

As illustrated in FIG. 2, preferably, the protective film 6 of the multilayered-reflective-film-provided substrate 110 according to the present embodiment includes a first layer 62 and a second layer 64 from the side closer to the substrate 1. Note that, in a case where the protective film 6 includes the first layer 62 and the second layer 64, the second layer 64 can be made identical to the protective film 6 described above.

In a case where the multilayered reflective film 5 is a Mo/Si periodic layered film, the reflectance of the multilayered reflective film 5 is likely to drop because of easy oxidation of Mo in the atmosphere. Thus, the uppermost layer of the multilayered reflective film 5 may be formed of a Si layer. Contact between the Si film and the protective film 6 including Ru as material causes silicon (Si) to diffuse easily to the protective film 6. That is, with time, Si moves and diffuses from the Si layer of the multilayered reflective film 5 to the Ru-based protective film 6 through grain boundaries in the Ru-based protective film 6 (then, Ru silicide (RuSi) is formed), and then reaches the surface layer of the Ru-based protective film 6. Then, Si has oxidation reaction to cleaning solution or gas, resulting in generation of $SiO_2$. Furthermore, in a case where the protective film 6 is not compact, cleaning solution or gas penetrates into the protective film 6, resulting in generation of $SiO_2$ in the protective film 6 (the inside or lower side of the protective film 6). Then, because of low adhesion between Ru and $SiO_2$, film detachment is likely to occur in a process of manufacture of the reflective mask 200 or due to repeated cleaning in use after completion as a product. The predetermined first layer 62 in the protective film 6 can inhibit silicon (Si) from diffusing from the multilayered reflective film 5 to the protective film 6.

For inhibition of silicon (Si) from diffusing from the multilayered reflective film 5 to the protective film 6, preferably, the first layer 62 includes ruthenium (Ru) and at least one of the following elements: magnesium (Mg), aluminum (Al), titanium (Ti), vanadium (V), chromium (Cr), germanium (Ge), zirconium (Zr), niobium (Nb), molybdenum (Mo), rhodium (Rh), hafnium (Hf), and tungsten (W). In particular, in a case where the first layer 62 is a RuTi film, a RuZr film, or a RuAl film, silicon (Si) can be more reliably inhibited from diffusing to the protective film 6.

The proportion of Ru in the Ru compound of the first layer 62 is preferably larger than 50% by atom and less than 100% by atom, or more preferably, 80% or more by atom and less than 100% by atom, or further preferably, larger than 95% by atom and less than 100% by atom.

In a case where the protective film 6 includes the first layer 62 and the second layer 64, the second layer 64 can be made identical to the protective film 6 described above. That is the second layer 64 can include ruthenium (Ru) and at least one additive material selected from the following elements: aluminum (Al), yttrium (Y), zirconium (Zr), rhodium (Rh), and hafnium (Hf). Moreover, the first layer 62 and the second layer 64 can be made identical in material but different in compositional ratio.

In a case where the first layer 62 is a RuTi-containing film (e.g., a RuTi film or a RuTiN film) (the same applies to a different RuY-containing film), preferably, the second layer 64 is a RuY-containing film, a RuZr-containing film, or a RuRh-containing film. In a case where the first layer 62 is a RuZr-containing film, preferably, the second layer 64 is a RuAl-containing film, a RuY-containing film, a RuZr-containing film, or a RuRh-containing film. In this case, the first layer 62 can inhibit silicon (Si) more reliably from diffusing to the protective film 6, and the second layer 64 enables the protective film 6 more reliably to have high resistance to etching gas and high resistance to cleaning.

The protective film 6 (at least one of the first layer 62 and the second layer 64) can include at least one of the elements N, C, O, H, and B, in the range of the effect according to the present embodiment. For achievement of an amorphous state with a drop in the crystallinity of the thin film, preferably, the protective film 6 (at least one of the first layer 62 and the second layer 64) includes at least one of nitrogen (N) and oxygen (O).

Preferably, the protective film 6 (at least one of the first layer 62 and the second layer 64) of the multilayered-reflective-film-provided substrate 110 according to the present embodiment further includes nitrogen (N). The protective film 6 (at least one of the first layer 62 and the second layer 64) further includes nitrogen (N), so that a drop can be made in crystallinity. As a result, the thin film can be compacted, so that the resistance to etching gas and the resistance to cleaning can be further enhanced. The proportion of N in the Ru compound of the protective film 6 (at least one of the first layer 62 and the second layer 64) is preferably larger than 1% by atom and 20% or less by atom, or more preferably, 3% or more by atom and 10% or less by atom.

Preferably, the protective film 6 (at least one of the first layer 62 and the second layer 64) of the multilayered-reflective-film-provided substrate 110 according to the present embodiment further includes oxygen (O). The protective film 6 (at least one of the first layer 62 and the second layer 64) further includes oxygen (O), so that a drop can be made in crystallinity. As a result, the thin film can be compacted, so that the resistance to etching gas and the resistance to cleaning can be further enhanced. The proportion of O in the Ru compound of the protective film 6 (at least one of the first layer 62 and the second layer 64) is preferably larger than 1% by atom and 20% or less by atom, or more preferably, 3% or more by atom and 10% or less by atom.

In the multilayered-reflective-film-provided substrate 110 according to the present embodiment, preferably, the content of Ru of the second layer 64 is less than the content of Ru of the first layer 62. For example, in a case where the first layer 62 is a RuTi film and the second layer 64 is a RuRh film, even when the content of Ti of the RuTi film that is the first layer 62 is relatively low, silicon (Si) can be inhibited from diffusing to the protective film 6. Thus, the content of Ru of the second layer 64 less than the content of Ru of the first layer 62 enables the resistance to etching gas and the resistance to cleaning to be further enhanced and additionally enables inhibition of silicon (Si) from diffusing to the protective film 6.

In the multilayered-reflective-film-provided substrate 110 according to the present embodiment, preferably, the refractive index of the second layer 64 is smaller than the refractive index of the first layer 62. As a result, a protective-film-provided substrate (the multilayered-reflective-film-provided substrate 110 including the protective film 6) can be fabricated without no drop in the reflectance of the multilayered reflective film 5 provided with the protective film 6 to EUV light. The refractive index of the second layer 64 is preferably 0.920 or less, or more preferably, 0.885 or less.

The protective film 6 (at least one of the first layer 62 and the second layer 64) described above can be formed by use of publicly known various types of methods. Examples of the methods for the protective film 6 include an ion-beam sputtering method, a sputtering method, a reactive sputtering method, a chemical vapor deposition (CVD) method, and a vacuum deposition method. In a case where the first layer 62 is deposited by use of the ion-beam sputtering method, the first layer 62 can be sequentially deposited after deposition of the multilayered reflective film 5. Thus, the ion-beam sputtering method may be preferable. Moreover, in a case where the protective film 6 (at least one of the first layer 62 and the second layer 64) is caused to contain at least one of nitrogen and oxygen, use of the reactive sputtering method may be preferable for stable deposition.

In a case where the protective film 6 includes the first layer 62 and the second layer 64, after formation of the first layer 62 and the second layer 64 or after formation of an absorber film 7, heat treatment can be performed. In the heat treatment, heating can be performed at a temperature higher than the prebaking temperature (approximately 110° C.) of a resist film 8 in a process of manufacture of a reflective mask blank 100. Specifically, the temperature condition of the heat treatment is typically 160° C. or more and 300° C. or less, or preferably, 180° C. or more and 250° C. or less.

In a process of the heat treatment, at least part of metal included in the first layer 62 diffuses into the second layer 64. Thus, the multilayered-reflective-film-provided substrate 110 having a compositional gradient region in which the content of the metal component included in the first layer 62 continuously decreases to the second layer 64, between the first layer 62 and the second layer 64, is acquired.

The thickness of the protective film 6 (total of the first layer 62 and the second layer 64) is not particularly limited as long as the protective film 6 can function. From the viewpoint of reflectance to EUV light, the thickness of the protective film 6 is preferably 1.0 to 8.0 nm, or more preferably, 1.5 to 6.0 nm. Moreover, the thickness of the first layer 62 is preferably 0.5 to 2.0 nm, or more preferably, 1.0 to 1.5 nm. Moreover, the thickness of the second layer 64 is preferably 1.0 to 7.0 nm, or more preferably, 1.5 to 4.0 nm.

<Reflective Mask Blank 100>

A reflective mask blank 100 according to the present embodiment will be described. The reflective mask blank 100 includes an absorber film 7 on the protective film 6 of the multilayered-reflective-film-provided substrate 110 described above.

<<Absorber Film 7>>

The absorber film 7 of the reflective mask blank 100 according to the present embodiment is formed on the multilayered reflective film 5 (on the protective film 6 in a case where the protective film 6 is formed). The absorber film 7 has a basic function of absorbing EUV light. The absorber film 7 may be intended for absorbing EUV light, or may have a phase shift property with respect to EUV light. The absorber film 7 having the phase shift property absorbs EUV light and additionally reflects part of EUV light to cause a phase shift. That is, in a reflective mask 200 in which the absorber film 7 having the phase shift property is patterned, the part on which the absorber film 7 is formed absorbs and reduces EUV light and additionally reflects partial light at a level at which no adverse effect occurs on pattern transfer. Moreover, in the region in which no absorber film 7 is formed (field portion), EUV light reflects from the multilayered reflective film 5 through the protective film 6. Thus, a desired phase difference occurs between the reflected light from the absorber film 7 having the phase shift property and the reflected light from the field portion. The absorber film 7 having the phase shift property is formed such that the phase difference between the reflected light from the absorber film 7 and the reflected light from the multilayered reflective film 5 becomes 170 to 190 degrees.

The reflected light from the absorber film 7 and the reflected light from the multilayered reflective film 5 inverse in phase at a phase difference of approximately 180 degrees, interfere with each other in a pattern edge portion, resulting in improvement in the image contrast of a projective optical image. Along with the improvement in the image contrast, a rise is made in resolution, so that rises can be made in various types of tolerance regarding exposure, such as exposure-amount tolerance and focal-point tolerance.

The absorber film 7 may be a single-layered film or a multilayered film including a plurality of films (e.g., a lower absorber film and an upper absorber film). For the single-layered film, as a feature, the number of processes at the time of mask-blank manufacture can be reduced, resulting in a rise in production efficiency. For the multilayered film, the optical constants and thickness of the upper absorber film can be properly set such that the upper absorber film functions as an anti-reflection film at the time of mask-pattern defect inspection with light. Thus, an improvement is made in inspection sensitivity at the time of mask-pattern defect inspection with light. Moreover, as the upper absorber film, use of a film to which, for example, oxygen (O) and nitrogen (N) are added for improvement in oxidation resistance causes improvement in temporal stability. As above, adoption of the multilayered film to the absorber film 7 enables addition of various functions. In a case where the absorber film 7 having the phase shift function is provided, adoption of such a multilayered film enables a large range of adjustment on the optical surface. Thus, a desired reflectance is easily acquired.

The material of the absorber film 7 is not particularly limited as long as it has properties of absorbing EUV light, being processable by etching or the like (preferably, being processable by dry etching with at least one of chlorine (Cl)-based gas and fluorine (F)-based gas), and having a high etching selectivity to the protective film 6 (second layer 64). As material having such properties, preferably, at least one metal selected from palladium (Pd), silver (Ag), platinum (Pt), gold (Au), iridium (Ir), tungsten (W), chromium (Cr), cobalt (Co), manganese (Mn), tin (Sn), tantalum (Ta), vanadium (V), nickel (Ni), hafnium (Hf), iron (Fe), copper (Cu), tellurium (Te), zinc (Zn), magnesium (Mg), germanium (Ge), aluminum (Al), rhodium (Rh), ruthenium (Ru), molybdenum (Mo), niobium (Nb), titanium (Ti), zirconium (Zr), yttrium (Y), and silicon (Si), or any compound thereof may be used.

The absorber film 7 can be formed by use of a magnetron sputtering method, such as a DC sputtering method or an RF sputtering method. For example, the absorber film 7 including, for example, a tantalum compound can be deposited, with a target including tantalum and boron, by use of the reactive sputtering method with argon gas to which oxygen or nitrogen is added.

A tantalum compound for formation of the absorber film 7 includes an alloy of Ta and any metal described above. In a case where the absorber film 7 includes a Ta alloy, from the viewpoint of smoothness and flatness, preferably, the crystal state of the absorber film 7 is an amorphous structure or a microcrystal structure. If the surface of the absorber film 7 is not smooth and flat, in some cases, the edge roughness of the absorber pattern 7a rises, resulting in deterioration in pattern dimensional precision. The surface roughness of the absorber film 7 is preferably 0.5 nm or less, or more preferably, 0.4 nm or less, or further preferably, 0.3 nm or less, in root mean square roughness (Rms).

Examples of tantalum compounds that can be used for formation of the absorber film 7 include a compound including Ta and B; a compound including Ta and N; a compound including Ta, O, and N; a compound including Ta and B and further including at least either O or N; a compound including Ta and Si; a compound including Ta, Si and N; a compound including Ta and Ge; and a compound including Ta, Ge, and N.

Ta is a material that has a large absorption coefficient to EUV light and can be easily subjected to dry etching with chlorine-based gas or fluorine-based gas. Thus, Ta is excellent in processability as the material of the absorber film 7. Furthermore, addition of at least one of B, Si, and Ge to Ta enables easy acquisition of an amorphous material. As a result, the smoothness of the absorber film 7 can be improved. Moreover, addition of at least one of N and O to Ta causes improvement in the oxidation resistance of the absorber film 7, resulting in acquisition of an effect that the temporal stability can be improved.

<<Back-Surface Conductive Film 2>>

A back-surface conductive film 2 for electrostatic chucking is formed on the second main surface (back-side main surface) of the substrate 1 (on the opposite side to the surface on which the multilayered reflective film 5 is formed or on an intermediate layer in a case where the intermediate layer, such as a hydrogen-entry inhibition film, is formed on the substrate 1). The required sheet resistance of the back-surface conductive film 2 for electrostatic chucking is typically 100Ω/□ (Ω/square) or less. A method of forming the back-surface conductive film 2 is, for example, a magnetron sputtering method or an ion-beam sputtering method, with a target of a metal, such as chromium or tantalum, or a target of an alloy thereof. The material including chromium (Cr) of the back-surface conductive film 2 is preferably a Cr compound containing Cr and at least one of the following elements: boron, nitrogen, oxygen, and carbon. Examples of the Cr compound include CrN, CrON, CrCN, CrCON, CrBN, CrBON, CrBCN, and CrBOCN. As the material including tantalum (Ta) of the back-surface conductive film 2, preferably tantalum (Ta), an alloy containing Ta, or a Ta compound containing either tantalum (Ta) or an alloy containing Ta and at least one of boron, nitrogen, oxygen, and carbon is used. Examples of the Ta compound include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, and TaSiCON. The back-surface conductive film 2 is not particularly limited in thickness as long as functioning for electrostatic chucking. The back-surface conductive film 2 is typically 10 to 200 nm in thickness. Moreover, the back-surface conductive film 2 is also intended for stress adjustment on the second main surface side of the reflective mask blank 100. That is, the back-surface conductive film 2 is adjusted to balance stress from each type of film formed on the first main surface side, resulting in acquisition of the reflective mask blank 100 that is flat.

Note that, before formation of the absorber film 7 described above, the back-surface conductive film 2 can be formed on the multilayered-reflective-film-provided substrate 110. That is, the back-surface conductive film 2 may be disposed on the second main surface of the multilayered-reflective-film-provided substrate 110 illustrated in FIGS. 1 and 2. Moreover, the reflective mask blank 100 does not necessarily include the back-surface conductive film 2.

<Etching Mask Film 9>

An etching mask film 9 may be formed on the absorber film 7. As the material of the etching mask film 9, a material causing a rise in the etching selectivity of the absorber film 7 to the etching mask film 9 may be used. Here, "the etching selectivity of B to A" means the ratio in etching rate of B (that is, a layer to which etching is desirable) to A (that is, a layer to which etching is undesirable, such as a layer for a mask). Specifically, use of the expression "the etching selectivity of B to A=the etching rate of B/the etching rate of A" results in specification of the ratio in etching rate. Moreover, "high selectivity" means a large value of selectivity to the comparison target in the definition. The etching selectivity of the absorber film 7 to the etching mask film 9 is preferably 1.5 or more, or more preferably, 3 or more.

Examples of the material causing a rise in the etching selectivity of the absorber film 7 to the etching mask film 9, include chromium and chromium compounds. In a case where the absorber film 7 is etched with fluorine-based gas, chromium or a chromium compound can be used as the material. For example, the chromium compound includes Cr and at least one element selected from N, O, C, and H. Moreover, in a case where the absorber film 7 is etched with chlorine-based gas including substantially no oxygen, silicon or a silicon compound can be used as the material. For example, the silicon compound includes Si and at least one element selected from N, O, C, and H. In addition, as the material, metallic silicon (metallic silicide) including silicon and metal, or a metallic silicon compound (metallic silicide compound) including a silicon compound and metal, may be provided. For example, the metallic silicon compound includes the metal, Si, and at least one element selected from N, O, C, and H.

Preferably, the reflective mask blank 100 according to the present embodiment includes the etching mask film 9 including chromium (Cr), on the absorber film 7. More preferably, the etching mask film 9 includes CrN, CrO, CrC, CrON, CrOC, CrCN, or CrOCN, or further preferably, a CrO-based film including chromium and oxygen (a CrO film, a CrON film, a CrOC film, or a CrOCN film).

Provision of the protective film 6 having the configuration described above enables inhibition of the protective film 6 from being damaged at the time of removal of the etching mask film 9 including chromium (Cr) by dry etching with a gaseous mixture of chlorine gas and oxygen gas.

Moreover, provision of the protective film 6 (or the second layer 64) including a RuAl-containing film, a RuY-containing film, or a RuRh-containing film enables, in a case where the etching mask film 9 includes silicon or a silicon compound, inhibition of the protective film 6 from being damaged at the time of removal of the etching mask film 9 by dry etching with fluorine-based gas. Therefore, wide selection in material or etching conditions for at least one of the absorber film 7 and the etching mask film 9 may be provided. The protective film 6 can be inhibited from being damaged by dry etching with fluorine-based gas. Thus, the multilayered-reflective-film-provided substrate 110 and the reflective mask blank 100 manufactured with a manufacturing method according to the present embodiment can have a resist film 8 in contact with the absorber film 7 without the etching mask film 9. The resist film 8 is subjected to drawing (exposure) of a desired pattern, such as a circuit pattern. Furthermore, the resist film 8 is developed and rinsed, resulting in formation of a predetermined resist pattern. With the resist pattern as a mask, the absorber film 7 is etched, resulting in formation of an absorber pattern.

The thickness of the etching mask film 9 is desirably 3 nm or more, from the viewpoint of acquisition of an etching mask having a function of forming a transfer pattern to the absorber film 7 precisely. Moreover, the thickness of the etching mask film 9 is desirably 15 nm or less, from the viewpoint of reduction in the thickness of the resist film 8.

<Additional Thin Film>

Preferably, the multilayered-reflective-film-provided substrate 110 and the reflective mask blank 100 according to the present embodiment each have, between a glass substrate that is the substrate 1 and the back-surface conductive film 2 containing tantalum or chromium, a hydrogen-entry inhibition film that inhibits hydrogen from entering from the substrate 1 to the back-surface conductive film 2. The presence of the hydrogen-entry inhibition film enables inhibition of hydrogen from being taken into the back-surface conductive film 2, so that the back-surface conductive film 2 can be inhibited from increasing in compressive stress.

As the material of the hydrogen-entry inhibition film, any type of material that causes hydrogen not to penetrate therethrough easily and is capable of inhibiting entry of hydrogen from the substrate 1 to the back-surface conductive film 2 may be provided. Specific examples of the material of the hydrogen-entry inhibition film include Si, $SiO_2$, SiON, SiCO, SiCON, SiBO, SiBON, Cr, CrN, CrON, CrC, CrCN, CrCO, CrCON, Mo, MoSi, MoSiN, MoSiO, MoSiCO, MoSiON, MoSiCON, TaO, and TaON. The hydrogen-entry inhibition film can be formed of a single layer of any of the materials or may be a multilayer or a compositional gradient film.

<Reflective Mask 200>

According to the present embodiment, a reflective mask 200 including an absorber pattern 7a on the multilayered reflective film 5, resulting from patterning of the absorber film 7 of the reflective mask blank 100 described above, is provided. Use of the reflective mask blank 100 according to the present embodiment enables acquisition of the reflective mask 200 including the protective film 6 having high resistance to etching gas and high resistance to cleaning.

The reflective mask 200 is manufactured with the reflective mask blank 100 according to the present embodiment. Herein, an outline will be given, and then detailed descriptions will be given in examples with reference to the drawings.

The reflective mask blank 100 is prepared, and a resist film 8 is formed on the outermost surface of the first main surface thereof (on the etching mask film 9 formed on the absorber film 7 as described in the following examples) (note that the process is not required in a case where the reflective mask blank 100 includes the resist film 8). The resist film 8 is subjected to drawing (exposure) of a desired pattern, such as a circuit pattern, and is further developed and rinsed, resulting in formation of a predetermined resist pattern 8a.

With the resist pattern 8a as a mask, the etching mask film 9 is subjected to dry etching, resulting in formation of an etching mask pattern 9a. Next, with the etching mask pattern 9a as a mask, the absorber film 7 is subjected to dry etching, resulting in formation of an absorber pattern 7a. Note that, as etching gas for dry etching to the absorber film 7, a gas selected from chlorine-based gas may be used, such as $Cl_2$, $SiCl_4$, or $CHCl_3$; a gaseous mixture including chlorine-based gas and $O_2$ at a predetermined proportion; a gaseous mixture including chlorine-based gas and He at a predetermined proportion; a gaseous mixture including chlorine-based gas and Ar at a predetermined proportion; fluorine-based gas, such as $CF_4$, $CHF_3$, $C_2F_6$, $C_3F_6$, $C_4F_6$, $C_4F_8$, $CH_2F_2$, $CH_3F$, $C_3F_8$, $SF_6$, or $F_2$; and a gaseous mixture including fluorine-based gas and $O_2$ at a predetermined proportion. Here, if the etching gas includes oxygen at the final stage of etching, surface roughness occurs on the Ru-based protective film 6. Thus, at the overetching stage where the Ru-based protective film 6 is subjected to etching, preferably, etching gas including no oxygen is used. After formation of the absorber pattern 7a, the etching mask pattern 9a can be removed by a gaseous mixture of chlorine-based gas and oxygen gas or fluorine-based gas.

After that, the resist pattern 8a is removed by ashing or a resist remover, resulting in fabrication of the absorber pattern 7a having a desired circuit pattern.

The above process enables acquisition of the reflective mask 200 according to the present embodiment.

<Method of Manufacturing Semiconductor Device>

According to the present embodiment, a method of manufacturing a semiconductor device is provided, the method including performing a lithography process with the reflective mask 200 described above by an exposure device to form a transfer pattern on an object to which transfer is to be performed. Specifically, the reflective mask 200 described above is set to the exposure device including an exposure light source that emits EUV light, so that the transfer pattern can be transferred to a resist film formed on a substrate to which transfer is to be performed. According to the method of the present embodiment, the semiconductor device having a fine and highly precise transfer pattern can be manufactured because the reflective mask 200 on which no adverse effect occurs in terms of the performance of the reflective mask 200, even in a case where impurities (a trace of material) are included in a thin film in the reflective mask 200, may be used.

Specifically, performing EUV exposure with the reflective mask 200 according to the present embodiment enables formation of a desired transfer pattern on a semiconductor substrate. In addition to the lithography process, performing various processes, such as etching to a film to be processed, formation of an insulating film and a conductive film, introduction of dopant, and annealing, enables the semiconductor device to which a desired electronic circuit is formed, to be manufactured at a high yield rate.

EXAMPLES

Examples will be described below. The present disclosure is not limited to the examples.

(Examples)

As the examples, multilayered-reflective-film-provided substrates 110 were fabricated, each including a multilayered reflective film 5 and a protective film 6 formed on the first main surface of a substrate 1. Table 1 shows the materials and compositions of the protective films 6 formed as the examples. The respective multilayered-reflective-film-provided substrates 110 according to the examples were similarly fabricated except for the protective films 6 different in type. The respective protective films 6 according to the examples that were used are as follows.

The protective films 6 according to Example 1-1 and Example 1-2 each are a RuAl film, and the protective film 6 according to Example 1-3 is a RuAlN film (refer to FIG. 1). The protective film 6 according to Example 1-4 includes two layers of a first layer 62 that is a RuZr film and a second layer 64 that is a RuAl film (refer to FIG. 2).

The protective films 6 according to Example 2-1 and Example 2-2 each are a RuY film, and the protective film 6 according to Example 2-3 is a RuYN film (refer to FIG. 1). The protective film 6 according to Example 2-4 includes two layers of a first layer 62 that is a RuTi layer and a second layer 64 that is a RuY film (refer to FIG. 2).

The protective films 6 according to Example 3-1 and Example 3-2 each are a RuZr film, and the protective film 6 according to Example 3-3 is a RuZrN film (refer to FIG. 1).

The protective film 6 according to Example 3-4 includes two layers of a first layer 62 that is a RuZr film and a second layer 64 that is a RuZr film (refer to FIG. 2).

The protective films 6 according to Example 4-1 and Example 4-2 each are a RuRh film, and the protective film 6 according to Example 4-3 is a RuRhN film (refer to FIG. 1). The protective film 6 according to Example 4-4 includes two layers of a first layer 62 that is a RuTi film and a second layer 64 that is a RuRh film (refer to FIG. 2).

The protective films 6 according to Example 5-1 and Example 5-2 each are a RuHf film, and the protective film 6 according to Example 5-3 is a RuHfN film (refer to FIG. 1). The protective film 6 according to Example 5-4 includes two layers of a first layer 62 that is a RuZr film and a second layer 64 that is a RuHf film (refer to FIG. 2).

The fabrication of the multilayered-reflective-film-provided substrate 110 according to each example was performed as follows.

As the substrate 1, a $SiO_2$—$TiO_2$-based glass substrate being a low-thermal-expansion glass substrate having the first main surface and the second main surface both polished and having a 6025 size (approximately 152×152×6.35 mm) was prepared. For flat and smooth main surfaces, polishing was performed, including a process of rough polishing treatment, a process of precise polishing treatment, a process of local treatment, and a process of touch polishing treatment.

Next, the multilayered reflective film 5 was formed on the first main surface of the substrate 1. The multilayered reflective film 5 is a periodic multilayered reflective film 5 including Si and Mo suitable to EUV light having a wavelength of 13.5 nm. Specifically, as a target of a high-refractive-index material and a target of a low-refractive-index material, a Si target and a Mo target were used. Ion-beam sputtering was performed with the targets supplied with krypton (Kr) ion particles from an ion source, to layer Si layers and Mo layers alternately on the substrate 1.

Here, the sputtered particles of Si and Mo entered at an angle of 30 degrees to the normal of the first main surface of the substrate 1. First, a Si layer was deposited to have a thickness of 4.2 nm, and subsequently a Mo layer was deposited to have a thickness of 2.8 nm. This process was defined as one cycle. Similarly, layering was performed for 40 cycles, and a Si layer was last deposited to have a thickness of 4.0 nm, resulting in formation of the multilayered reflective film 5. Therefore, the lowermost layer of the multilayered reflective film 5, namely, the material of the multilayered reflective film 5 closest to the substrate 1 is Si. Moreover, the uppermost layer of the multilayered reflective film 5, namely, the material of the multilayered reflective film 5 to be in contact with the protective film 6 is Si.

Next, the corresponding protective film 6 shown in Table 1 was formed on the surface of the multilayered reflective film 5 by use of an ion-beam sputtering method. For example, for the protective film 6 according to Example 1-1, as the target for the ion-beam sputtering method, a RuAl mixed sintered target was used for the composition shown in Table 1. In the atmosphere of Ar gas, the protective film 6 according to Example 1-1 including the RuAl film having the composition shown in Table 1 to have the thickness shown in Table 1 was deposited, by use of the ion-beam sputtering method with the RuAl mixed sintered target. Here, the sputtered particles of Ru and Al entered at an angle of 30 degrees to the normal of the first main surface of the substrate 1. The protective films 6 according to the other examples were deposited, similarly to the protective film 6 according to Example 1-1.

Note that the protective films 6 according to Example 1-3, Example 2-3, Example 3-3, Example 4-3, and Example 5-3 each include nitrogen (N). The protective films 6 each were deposited by reactive sputtering in the atmosphere of a gaseous mixture of Ar gas and $N_2$ gas.

Moreover, the protective films 6 according to Example 1-4, Example 2-4, Example 3-4, Example 4-4, and Example 5-4 each include two layers of the first layer 62 and the second layer 64. Thus, according to the examples, after the first layer 62 was deposited, the second layer 64 was deposited. Table 2 shows the compositions and thicknesses of the first layers 62 according to the examples. Moreover, Table 1 shows the compositions and thicknesses of the second layers 64 according to the examples.

As described above, the multilayered-reflective-film-provided substrates 110 according to the examples were manufactured.

Comparative Example 1

A multilayered-reflective-film-provided substrate 110 according to Comparative Example 1 was manufactured, similarly to that according to Example 1-1, except for the protective film 6 being a single layer including only Ru as material. The protective film 6 according to Comparative Example 1 including a Ru film was deposited to have the thickness shown in Table 1 by use of an ion-beam sputtering method with a Ru target in the atmosphere of Ar gas.
(Reflective Mask Blank 100)

Reflective mask blanks 100 were manufactured with the multilayered-reflective-film-provided substrates 110 according to the examples and Comparative Example 1, each reflective mask blank 100 including an absorber film 7 and an etching mask film 9. A method of manufacturing a reflective mask blank 100 will be described below.

An absorber film 7 was formed on the protective film 6 of a multilayered-reflective-film-provided substrate 110, by use of a DC magnetron sputtering method. The absorber film 7 is a layered film including two layers: a TaN film (that is, an absorptive layer), and a TaO film (that is, a low reflective layer). The TaN film was deposited as an absorptive layer on the surface of the protective film 6 of the multilayered-reflective-film-provided substrate 110 described above, by use of the DC magnetron sputtering method. With the multilayered-reflective-film-provided substrate 110 opposed to a Ta target, the TaN film was deposited by use of a reactive sputtering method in the atmosphere of a gaseous mixture of Ar gas and $N_2$ gas. Next, furthermore, the TaO film (low reflective layer) was formed on the TaN film by use of the DC magnetron sputtering method. Similarly to the TaN film, with the multilayered-reflective-film-provided substrate 110 opposed to the Ta target, the TaO film was deposited by use of the reactive sputtering method in the atmosphere of a gaseous mixture of Ar and $O_2$.

The TaN film has the following composition (atomic ratio): Ta:N=70:30 and has a thickness of 48 nm. Moreover, the TaO film has the following composition (atomic ratio): Ta:O=35:65 and a thickness of 11 nm.

Next, an etching mask film 9 including a CrOCN film was formed on the absorber film 7 by use of the DC magnetron sputtering method. The CrOCN film was deposited with a Cr target by reactive sputtering in the atmosphere of a gaseous mixture of Ar gas, $N_2$ gas, and $CO_2$ gas. The etching mask film 9 was deposited to have a thickness of 5 nm.

Next, a back-surface conductive film 2 including CrN was formed on the second main surface (back-side main surface) of the substrate 1 by a magnetron sputtering method (reactive sputtering method) under the following conditions. The conditions of formation of the back-surface conductive film 2: Cr target, the atmosphere of a gaseous mixture of Ar and $N_2$ (Ar: 90% by atom, N: 10% by atom), and the thickness 20 nm.

As above, the reflective mask blanks 100 according to the examples and Comparative Example 1 were manufactured. (Reflective Mask 200)

Next, reflective masks 200 were manufactured with the reflective mask blanks 100 according to the examples and Comparative Example 1. Manufacture of a reflective mask 200 will be described with reference to FIGS. 8A-8F.

Figures 8A, 8B, 8C, 8D, 8E, 8F:
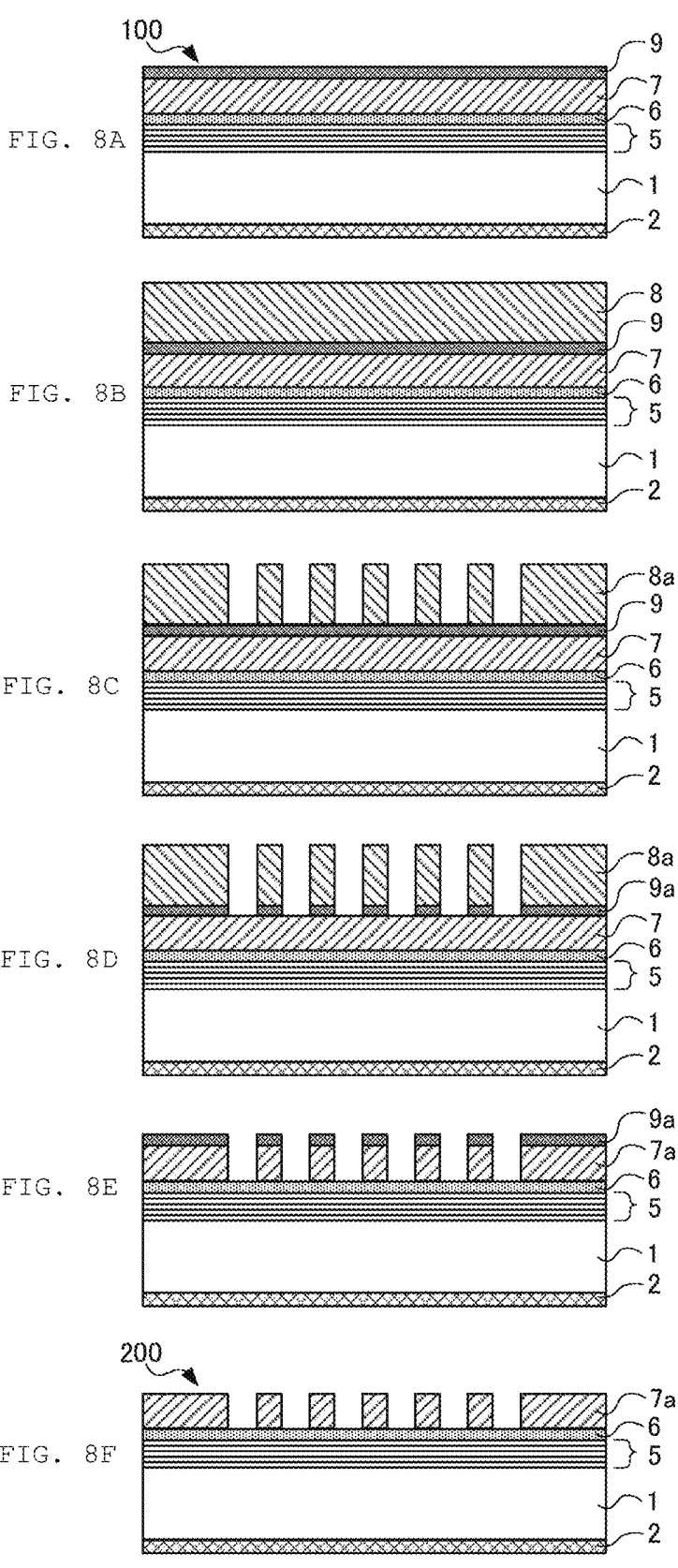
FIGS. 8A to 8F are schematic sectional views that illustrate a process of an exemplary method of manufacturing a reflective mask according to the present embodiment.

FIG. 8A is a schematic sectional view of an exemplary reflective mask blank 100 as described herein (e.g., with reference to FIG. 4). First, as illustrated in FIG. 8B, a resist film 8 was formed on the etching mask film 9 of the reflective mask blank 100. Then, the resist film 8 was subjected to drawing (exposure) of a desired pattern, such as a circuit pattern, and was further developed and rinsed, resulting in formation of a predetermined resist pattern 8a (FIG. 8C). Next, with the resist pattern 8a as a mask, the etching mask film 9 was subjected to dry etching with a gaseous mixture of $Cl_2$ gas and $O_2$ gas ($Cl_2+O_2$ gas), resulting in formation of an etching mask pattern 9a (FIG. 8D). The resist pattern 8a was removed by oxygen ashing. With the etching mask pattern 9a as a mask, the TaO film (low reflective layer) of the absorber film 7 was subjected to dry etching with $CF_4$ gas, and subsequently the TaN film was subjected to dry etching with $Cl_2$ gas, resulting in formation of an absorber pattern 7a (FIG. 8E).

After that, the etching mask pattern 9a was removed by dry etching with a gaseous mixture of $Cl_2$ gas and $O_2$ gas ($Cl_2+O_2$ gas) (FIG. 8F). Finally, wet cleaning was performed with deionized water (DIW), resulting in manufacture of each of the reflective masks 200 according to the examples and Comparative Example 1.

As above, the reflective masks 200 according to the examples and Comparative Example 1 were manufactured. (Evaluation of Reflective Masks 200 According to Examples and Comparative Example 1)

For each of the examples and Comparative Example 1, the influence of dry etching at the time of removal of the etching mask pattern 9a was evaluated.

Specifically, for each of the examples and Comparative Example 1, a mask blank having the structure illustrated in FIG. 4 was manufactured. In the process of manufacture of the reflective mask 200 described above, an etching mask pattern 9a and an absorber pattern 7a corresponding to those in FIG. 8E were formed. Note that the patterned shape of the absorber pattern 7a for evaluation exposes the surface of the protective film 6 widely so that the reflectance to EUV light at the exposed part of the surface of the protective film 6 can be measured. After formation of the absorber pattern 7a, the reflectance of the surface of the protective film 6 to EUV light having a wavelength of 13.5 nm (pre-etching reflectance) was measured. Next, the etching mask pattern 9a of a CrOCN film was removed by dry etching with a gaseous mixture of $Cl_2$ gas and $O_2$ gas ($Cl_2:O_2=9:1$) (FIG. 8F). After removal of the etching mask pattern 9a by etching, the reflectance of the surface of the protective film 6 to EUV light having a wavelength of 13.5 nm (post-etching reflectance) was measured. The field A of Table 3 shows the variation in reflectance before and after removal of the etching mask pattern 9a by etching (post-etching reflectance/pre-etching reflectance). The variation in reflectance is indicated by ratio, with Comparative Example 1 defined as 1.

Moreover, the variation in the thickness of the protective film 6 at the time of the dry etching with a gaseous mixture of $Cl_2$ gas and $O_2$ gas ($Cl_2+O_2$ gas) described above was measured. With the etching rate of the Ru film of the protective film 6 due to the gaseous mixture in Comparative Example 1 defined as 1, the etching rate in each example was calculated by ratio. The field B of Table 3 shows the ratio of the etching rate of the protective film 6 due to the gaseous mixture.

As is obvious from Table 3, in all the examples in comparison to Comparative Example 1, the variation in reflectance before and after removal of the etching mask pattern 9a by etching is small. Moreover, in all the examples in comparison to Comparative Example 1, the etching rate of the protective film 6 due to the gaseous mixture ($Cl_2+O_2$ gas) is small. Therefore, it was found that the protective films 6 according to the examples of the present embodiment each have high resistance to the etching gas for removal of the etching mask film 9.

Moreover, from additional measurement of the resistance of the protective film 6 to cleaning with sulfuric acid and hydrogen peroxide mixture (SPM), in all the examples in comparison to Comparative Example 1, because of a small variation in thickness before and after the cleaning and a small variation in reflectance to EUV light, it was found that the protective film 6 has high resistance to the cleaning.

Table 4 shows, based on measurement of the reduction rate in thickness due to SPM cleaning under the following conditions, ratios to Comparative Example 1 (Ru film) defined as 1.

Cleaning solution: $H_2SO_4:H_2O_2=2:1$ (weight ratio)

Cleaning temperature: 120° C.

Cleaning duration: 10 minutes

As is obvious from Table 4, Example 4-2 (Ru:Rh=70:30) and Example 4-3 (Ru:Rh:N=65:30:5) are higher in SPM cleaning resistance than in Example 4-1 (Ru:Rh=80:20). Note that, because the protective film according to Example 4-4 is identical to that according to Example 4-2, the ratio of the reduction rate thereof to Comparative Example 1 (Ru film) defined as 1 is identical to the ratio according to Example 4-2.

(Manufacture of Semiconductor Device)

With the reflective mask 200 manufactured with the multilayered-reflective-film-provided substrate 110 according to each example, set in an EUV scanner, EUV exposure was performed to a wafer including a film to be processed and a resist film formed on a semiconductor substrate. Then, the resist film having been exposed was developed, resulting in formation of a resist pattern on the semiconductor substrate having the film to be processed formed thereon.

The reflective mask 200 manufactured with the multilayered-reflective-film-provided substrate 110 according to each example, includes the protective film having high resistance to etching gas and high resistance to cleaning. Thus, formation of a fine and highly precise transfer pattern (resist pattern) was achieved.

The resist pattern was transferred, by etching, to the film to be processed, and various processes, such as formation of an insulating film and a conductive film, introduction of dopant, and annealing, were performed, resulting in manufacture of a semiconductor device having desired characteristics at a high yield rate.

TABLE 1

| | Protective film (or second layer) Composition (% by atom) | | | | | | | Thickness (nm) | Presence or absence of first layer (refer to Table 2 for composition and thickness) |
|---|---|---|---|---|---|---|---|---|---|
| | Ru | Al | Y | Zr | Rh | Hf | N | | |
| Example 1-1 | 95 | 5 | | | | | | 3 | Absence |
| Example 1-2 | 90 | 10 | | | | | | 3 | Absence |
| Example 1-3 | 85 | 10 | | | | 5 | | 3 | Absence |
| Example 1-4 | 90 | 10 | | | | | | 2 | Presence (RuZr film) |
| Example 2-1 | 90 | | 10 | | | | | 3 | Absence |
| Example 2-2 | 80 | | 20 | | | | | 3 | Absence |
| Example 2-3 | 75 | | 20 | | | 5 | | 3 | Absence |
| Example 2-4 | 80 | | 20 | | | | | 2 | Presence (RuTi film) |
| Example 3-1 | 90 | | | 10 | | | | 3 | Absence |
| Example 3-2 | 80 | | | 20 | | | | 3 | Absence |
| Example 3-3 | 75 | | | 20 | | 5 | | 3 | Absence |
| Example 3-4 | 80 | | | 20 | | | | 2 | Presence (RuZr film) |
| Example 4-1 | 80 | | | | 20 | | | 3 | Absence |
| Example 4-2 | 70 | | | | 30 | | | 3 | Absence |
| Example 4-3 | 65 | | | | 30 | 5 | | 3 | Absence |
| Example 4-4 | 70 | | | | 30 | | | 2 | Presence (RuTi film) |
| Example 5-1 | 95 | | | | | 5 | | 3 | Absence |
| Example 5-2 | 90 | | | | | 10 | | 3 | Absence |
| Example 5-3 | 85 | | | | 5 | 10 | | 3 | Absence |
| Example 5-4 | 90 | | | | | 10 | | 2 | Presence (RuZr film) |
| Comparative Example 1 | 100 | | | | | | | 2.5 | Absence |

TABLE 2

| | Composition of first layer (% by atom) | | | | | | | | | | | | | | Thickness (nm) |
|---|---|---|---|---|---|---|---|---|---|---|---|---|---|---|---|
| | Ru | Mg | Al | Ti | V | Cr | Ge | Zr | Nb | Mo | Rh | Hf | Ta | w | |
| Example 1-4 | 95 | | | | | | | 5 | | | | | | | 1 |
| Example 2-4 | 95 | | | 5 | | | | | | | | | | | 1 |
| Example 3-4 | 90 | | | | | | | 10 | | | | | | | 1 |
| Example 4-4 | 95 | | | 5 | | | | | | | | | | | 1 |
| Example 5-4 | 95 | | | | | | | 5 | | | | | | | 1 |
| Comparative Example 1 | — | — | — | — | — | — | — | — | — | — | — | — | — | — | — |

TABLE 3

| | A. Variation in reflectance before and after etching due to a gaseous mixture (Cl$_2$ + O$_2$ gas) (ratio to comparative example) | B. Ratio of etching rate of protective film due to a gaseous mixture (Cl$_2$ + O$_2$ gas) (ratio to comparative example) |
|---|---|---|
| Example 1-1 | 0.66 | 0.95 |
| Example 1-2 | 0.50 | 0.8 |
| Example 1-3 | 0.48 | 0.8 |
| Example 1-4 | 0.42 | 0.8 |
| Example 2-1 | 0.55 | 0.6 |
| Example 2-2 | 0.45 | 0.51 |
| Example 2-3 | 0.40 | 0.51 |
| Example 2-4 | 0.33 | 0.42 |
| Example 3-1 | 0.55 | 0.66 |
| Example 3-2 | 0.50 | 0.33 |
| Example 3-3 | 0.45 | 0.33 |
| Example 3-4 | 0.33 | 0.33 |
| Example 4-1 | 0.33 | 0.33 |
| Example 4-2 | 0.25 | 0.16 |
| Example 4-3 | 0.20 | 0.16 |

TABLE 3-continued

| | A. Variation in reflectance before and after etching due to a gaseous mixture (Cl$_2$ + O$_2$ gas) (ratio to comparative example) | B. Ratio of etching rate of protective film due to a gaseous mixture (Cl$_2$ + O$_2$ gas) (ratio to comparative example) |
|---|---|---|
| Example 4-4 | 0.13 | 0.16 |
| Example 5-1 | 0.66 | 0.62 |
| Example 5-2 | 0.53 | 0.43 |
| Example 5-3 | 0.48 | 0.43 |
| Example 5-4 | 0.40 | 0.43 |
| Comparative Example 1 | 1 | 1 |

TABLE 4

| | Ratio to Comparative Example 1 (Ru film) defined as 1, based on measurement of reduction rate in thickness due to SPM cleaning |
|---|---|
| Example 1-2 | 0.01 |
| Example 4-1 | 0.07 |
| Example 4-2 | 0.05 |
| Example 4-3 | 0.05 |

What is claimed is:

1. A multilayered-reflective-film-provided substrate comprising:

a substrate;

a multilayered reflective film provided above the substrate; and a protective film provided above the multilayered reflective film, wherein the protective film includes a first layer including a ruthenium (Ru) compound containing ruthenium (Ru), rhodium (Rh) and at least one of the following elements: magnesium (Mg), aluminum (Al), vanadium (V), chromium (Cr), germanium (Ge), hafnium (Hf) and tungsten (W), wherein a proportion of Ru in the Ru compound is greater than 50% by atom and less than 100% by atom.

2. The multilayered-reflective-film-provided substrate according to claim 1, wherein;

the protective film further includes a second layer, the second layer includes ruthenium (Ru) and an additive material, and the additive material includes at least one of the following elements: aluminum (Al), yttrium (Y), zirconium (Zr), rhodium (Rh), and hafnium (Hf).

3. The multilayered-reflective-film-provided substrate according to claim 1, wherein the first layer further includes nitrogen (N).

4. The multilayered-reflective-film-provided substrate according to claim 2, wherein
    a content of Ru in the second layer is less than a content of Ru in the first layer.

5. A reflective mask blank comprising:
    a substrate;
    a multilayered reflective film provided above the substrate;
    a protective film provided above the multilayered reflective film; and
    an absorber film above the protective film, wherein
    the protective film includes a first layer including a ruthenium (Ru) compound containing ruthenium (Ru), rhodium (Rh) and at least one of the following elements: magnesium (Mg), aluminum (Al), vanadium (V), chromium (Cr), germanium (Ge), hafnium (Hf) and tungsten (W),
    wherein a proportion of Ru in the Ru compound is greater than 50% by atom and less than 100% by atom.

6. The reflective mask blank according to claim 5, wherein
    the protective film further includes a second layer,
    the second layer includes ruthenium (Ru) and an additive material, and
    the additive material includes at least one of the following elements: aluminum (Al), yttrium (Y), zirconium (Zr), rhodium (Rh), and hafnium (Hf).

7. The reflective mask blank according to claim 6, wherein the first layer further includes nitrogen (N).

8. The reflective mask blank according to claim 6, wherein
    a content of Ru in the second layer is less than a content of Ru in the first layer.

9. The reflective mask blank according to claim 5, further comprising:
    an etching mask film including chromium (Cr), above the absorber film.

10. A reflective mask comprising:
    a substrate;
    a multilayered reflective film provided above the substrate;
    a protective film provided above the multilayered reflective film; and
    an absorber pattern above the protective film, wherein:
    the protective film includes a first layer including a ruthenium (Ru) compound containing ruthenium (Ru), rhodium (Rh) and at least one of the following elements: magnesium (Mg), aluminum (Al), vanadium (V), chromium (Cr), germanium (Ge), hafnium (Hf) and tungsten (W), and
    wherein a proportion of Ru in the Ru compound is greater than 50% by atom and less than 100% by atom.

11. The reflective mask according to claim 10, wherein;
    the protective film further includes a second layer,
    the second layer includes ruthenium (Ru) and an additive material, and
    the additive material includes at least one of the following elements: aluminum (Al), yttrium (Y), zirconium (Zr), rhodium (Rh), and hafnium (Hf).

12. The reflective mask according to claim 11, wherein the first layer further includes nitrogen (N).

13. The reflective mask according to claim 11, wherein
    a content of Ru in the second layer is less than a content of Ru in the first layer.

14. A method of manufacturing a reflective mask, the method comprising:
    patterning the etching mask film of the reflective mask blank according to claim 9 to form an etching mask pattern;
    patterning the absorber film with the etching mask pattern as a mask, to form an absorber pattern; and
    removing the etching mask pattern by a gaseous mixture of chlorine-based gas and oxygen gas.

15. A method of manufacturing a semiconductor device, the method comprising:
    setting the reflective mask according to claim 10 to an exposure device including an exposure light source that emits EUV light; and
    transferring a transfer pattern to a resist film formed on a substrate to which transfer is to be performed.

16. The multilayered-reflective-film-provided substrate according to claim 1, wherein
    a content of Rh in the first layer is 15% or more by atom and less than 50% by atom.

17. The multilayered-reflective-film-provided substrate according to claim 3, wherein
    a content of N in the first layer is 1% or more by atom and less than 20% by atom.

18. The reflective mask blank according to claim 5, wherein
    a content of Rh in the first layer is 15% or more by atom and less than 50% by atom.

19. The reflective mask blank according to claim 7, wherein
    a content of N in the first layer is 1% or more by atom and less than 20% by atom.

20. The reflective mask according to claim 10, wherein
    a content of Rh in the first layer is 15% or more by atom and less than 50% by atom.

21. The reflective mask according to claim 12, wherein
    a content of N in the first layer is 1% or more by atom and less than 20% by atom.

* * * * *